United States Patent [19]

Hurley et al.

[11] Patent Number: 4,467,434
[45] Date of Patent: Aug. 21, 1984

[54] SOLID STATE WATT-HOUR METER

[75] Inventors: James R. Hurley, Brookfield; Clyde Gilker, S. Milwaukee, both of, WI

[73] Assignee: McGraw-Edison Co., Rolling Meadows, Ill.

[21] Appl. No.: 303,627

[22] Filed: Sep. 18, 1981

[51] Int. Cl.³ .............................................. G01R 21/00
[52] U.S. Cl. .................. 364/483; 324/103 R; 324/142
[58] Field of Search .................. 364/483; 324/117 H, 324/142, 103 R

[56] References Cited

U.S. PATENT DOCUMENTS

| | | | |
|---|---|---|---|
| 3,317,835 | 5/1967 | Dietz et al. | 324/117 |
| 3,328,689 | 6/1967 | Rainer | 324/117 |
| 3,343,084 | 9/1967 | Gambale et al. | 324/103 |
| 3,505,508 | 4/1970 | Leyde | 235/151.31 |
| 3,522,421 | 8/1970 | Miller | 235/151.21 |
| 3,789,201 | 1/1974 | Carpenter et al. | 235/151.21 |
| 3,921,069 | 11/1975 | Milkovic | 324/107 |
| 4,034,233 | 7/1977 | Leyde | 307/41 |
| 4,059,747 | 11/1977 | Brody | 364/493 |
| 4,075,699 | 2/1978 | Schneider et al. | 364/492 |
| 4,080,568 | 3/1978 | Funk | 324/142 |
| 4,132,981 | 1/1979 | White | 340/825.52 |
| 4,133,034 | 1/1979 | Etter | 364/483 |
| 4,197,582 | 4/1980 | Johnston et al. | 364/483 |
| 4,213,119 | 7/1980 | Ward et al. | 340/151 |
| 4,213,182 | 7/1980 | Eichelberger et al. | 364/493 |
| 4,240,030 | 12/1980 | Bateman et al. | 324/110 |
| 4,241,237 | 12/1980 | Paraskevakos et al. | 179/2 AM |
| 4,253,151 | 2/1981 | Bouve | 364/483 |
| 4,283,643 | 8/1981 | Levin | 307/309 |
| 4,283,772 | 8/1981 | Johnston | 364/483 |
| 4,293,915 | 10/1981 | Carpenter et al. | 364/493 |

FOREIGN PATENT DOCUMENTS

0015666 2/1980 European Pat. Off. .

Primary Examiner—Errol A. Krass
Assistant Examiner—Clifford L. Tager
Attorney, Agent, or Firm—Jon C. Gealow; James A. Gabala; Tom Vigil

[57] ABSTRACT

A watt-hour meter is disclosed which includes: a microprocessor coupled to a solid-state Hall-Effect sensor; an electrically alterable ROM coupled to the microprocessor; a power supply; a power outage timing means using the discharge characteristic of a capacitor; apparatus for supplying a 60 Hz clock signal to the microprocessor; a readout device coupled to the microprocessor to provide an indication of the power consumed; an output on the microprocessor for controlling a circuit breaker; and a switch for overriding the microprocessor controlled circuit breaker. The microprocessor and the electrically alterable ROM are connected and programmed: to sense the time of day as determined from an initial time of day and setting the 60 Hz clock signal; to sense and compute the power used by the consumer; to automatically open the circuit breaker when power demand on the electric power source is high and/or the cost per kilowatt hour is high; to automatically close the circuit breaker when the power demand on the source of electric power is low and/or the cost per kilowatt power is low; and to allow a consumer to override the microprocessor's control of the circuit breaker.

4 Claims, 13 Drawing Figures

POWER FAILURE TIMER ROUTINE CONT'D

FIG. 9

COMMUNICATIONS/METER READ ROUTINE

SOLID STATE WATT-HOUR METER

BACKGROUND OF THE INVENTION
1. Field of the Invention

The present invention relates to electronic watt-hour meters which include a solid state microprocessor coupled to a watt-hour sensor.

2. Description of the Prior Art

Heretofore, various electronic watt-hour meters incorporating a microprocessor therein have been proposed. Such electronic watt-hour meters have provided for monitoring of and storing of information related to power demand and power use by a consumer. Also, such meters have included circuitry, programming and switches connected to various consumer loads for enabling the microprocessor to switch off or de-energize certain consumer loads during high electric use periods, e.g., daytime, and to switch on or energize these loads during low electric use periods, e.g., night-time.

Examples of such previously proposed electronic watt-hour meters are disclosed in the following U.S. patents:

| U.S. Pat. No. | Patentee |
| --- | --- |
| 3,505,508 | Leyde |
| 3,522,421 | Miller |
| 3,789,201 | Carpenter, et al. |
| 4,034,233 | Leyde |
| 4,059,747 | Brody |
| 4,075,699 | Schneider, et al. |
| 4,240,030 | Bateman, et al. |
| 4,241,237 | Paraskevakos, et al. |
| 4,253,151 | Bouve |

See also European Patent Application Publication No. 0015666 for: Apparatus for Controlling Electric Power Consumption, filed by South Eastern Electricity Board, Queens Gardens Hove, Sussex, England.

Still further, it has been proposed to utilize a Hall-effect sensor for monitoring and measuring the electric power consumption by a consumer in an electronic watt-meter. Examples of such previously proposed Hall-effect sensors and watt-meters are disclosed in the following U.S. patents:

| U.S. Pat. No. | Patentee |
| --- | --- |
| 3,317,835 | Dietz, et al |
| 3,328,689 | Raines, et al |
| 3,343,084 | Gambale |
| 3,921,069 | Milkovic |
| 4,283,643 | Levin, et al |

As will be described in greater detail hereinafter, the solid state watt-hour meter of the present invention differs from the previously proposed electronic watt-hour meters by not only providing a solid state Hall-effect sensor and time/load switching functions in the microprocessor of the meter but also by providing a reset function whenever there is a consumer-initiated override of the time/load switching function of the microprocessor.

SUMMARY OF THE INVENTION

According to the invention, there is provided a solid state watt-hour meter comprising a watt-hour sensor adapted to be coupled to a consumer's connection to a source of electric power for sensing the voltage supplied to, and the current drawn by, the consumer's total electric load and for producing an output signal indicative of a quantity of watt-hours of power utilized by the consumer; a microprocessor coupled to said watt-hour sensor for receiving said output signals; an electrically alterable ROM coupled to said microprocessor; power supply means having an input coupled to the consumer line voltage and an output coupled to said microprocessor for supplying a regulated DC voltage thereto; clock signal generating means coupled between the consumer line voltage and said microprocessor for supplying a 60 Hz clock signal to said microprocessor; readout means coupled to said microprocessor for providing a readout of the power consumed since the last reading of said solid state watt-hour meter; at least one load control circuit breaker in a consumer's unit supply line to at least one consumer load, said microprocessor having at least one load control output coupled to said at least one circuit breaker; an override switch coupled to said meter and said microprocessor and said electrically alterable ROM being connected and programmed:

(a) to sense the time of day as determined from an initial time of day setting and the 60 Hz clock signal;

(b) to sense and totalize signals from said sensor indicating the total power used by the consumer;

(c) to provide a readout signal indicative of the total power consumed since the last reading of the meter;

(d) to automatically open said at least one circuit breaker for a time period during the time of day (daytime) when power demand on the electric power source is high and/or the cost per kilowatt hour is high;

(e) to automatically close said at least one circuit breaker during the time of day (night-time) when the power demand on the source of electric power is low and/or the cost per kilowatt power is low;

(f) to allow a consumer to override said microprocessor control of said at least one circuit breaker by operating said override switch to close said at least one circuit breaker; and (g) to automatically reset and override switch to the open position thereof when said microprocessor is in the operating mode for automatically closing said at least one circuit breaker.

DESCRIPTION OF THE PREFERRED EMBODIMENT

While this invention will be described in connection with a preferred embodiment, it should be understood that it is not intended to limit the invention to that specific embodiment. On the contrary, it is intended to cover all alternatives, modifications, and equivalents which may be included within the spirit and scope of the invention as defined by the appended claims. It should be understood that the present invention disclosure is to be considered an exemplification of the principles of the invention.

Figure 1:
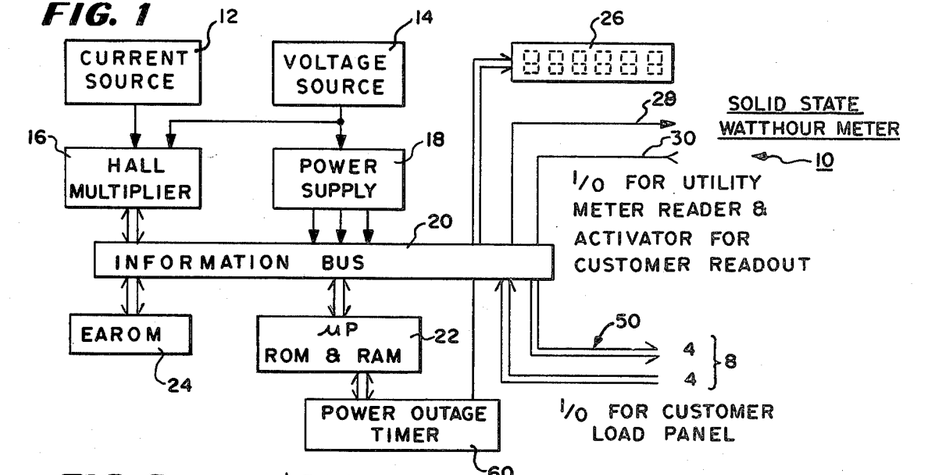
FIG. 1 is a block diagram of the solid state watt-hour meter of the present invention.

Referring now to FIG. 1, there is illustrated therein a block diagram of the solid state watt-hour meter of the present invention which is generally identified by the reference numeral 10. The solid state watt-hour meter 10 includes a current sensing device (current source) 12 and a voltage sensing device (voltage source) 14 which are coupled to a Hall-effect sensing and multiplying device (Hall multiplier) 16. The voltage source 14 is also coupled to a regulated power supply 18 which supplies DC operating voltage through an information bus 20 to a microprocessor (with RAM and ROM) 22.

As will be described in greater detail hereinafter in connection with the description of FIG. 5, the power supply 18 also supplies a 60 Hz square wave clock signal to the microprocessor 22.

The microprocessor 22 with built-in ROM memory contains the operation program and decision center for controlling the operation of the meter 10. The built-in RAM memory in the microprocessor 22 is available for "scratchpad work".

Also connected to the bus 20 is a non-volatile electrically alterable ROM (EAROM) 24. This non-volatile memory 24 is available for storing information that is changeable or changing and that must be retained in the event of loss of power. Typically, such information would include the content of the watt-hour register, the demand register and related time, times related to time of day or time of use periods, calibration contants, serial numbers, account numbers, security numbers, etc.

The meter 10 further includes a readout device 26 which is coupled to the bus 20 and which is preferably a 6-digit seven-segment LED display 26. The meter 10 can be factory preprogrammed to display any information in the meter 10. However, long running displays would be difficult to follow even by a trained and skilled observer and would be subject to transcribing errors. Thus, to keep the display simple, two optical input/output (I/O) ports 28 and 30 (FIG. 4) are provided in a housing 31 of the meter 10. Behind one I/O port 28 is an electro/optical device, namely, a phototransistor 32 (FIG. 5). The meter 10 is then programmed so that a light directed into the I/O port 28 by a customer will cause the meter to present an output, such as total watt hours used since the last reading, on the LED display 26.

Figure 4:
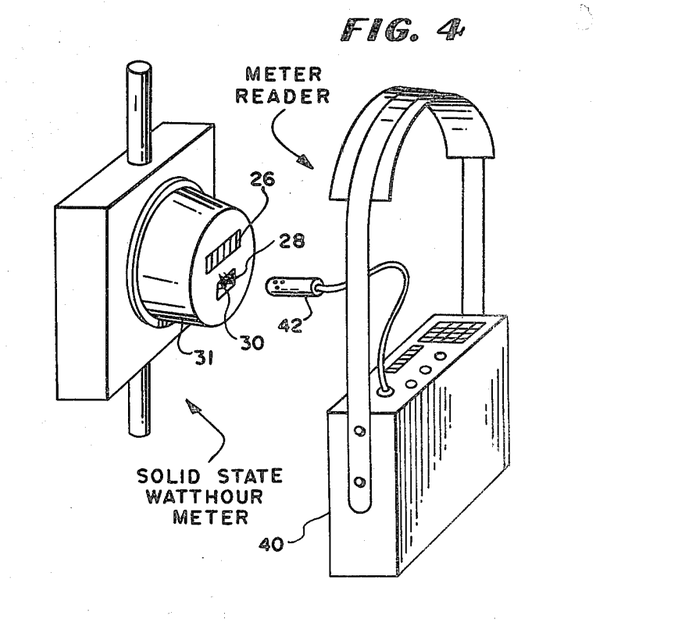
FIG. 4 is a perspective view of the solid state watt-hour meter and a meter reading unit.

In addition to the phototransistor 32, an electro/optical device (see FIG. 5), namely, an LED 34, is located behind the I/O port 30 (See FIG. 4). It forms an input/output pair with the phototransistor 32. This input/output pair 32 and 34 are capable of transmitting data into or out of the meter 10 at a relatively high rate.

As shown in FIG. 4, a meter reading unit 40 is provided which is particularly adapted for use with the meter 10. The unit 40 includes an optical plug, terminal or wand 42 which is adapted to be placed over the I/O ports 28 and 30. Inside the unit 40 is a microprocessor (see FIG. 5) and associated computer components to form a microprocessor system which includes an optical input/output pair identical to the input/output pair 32 and 34 which is coupled by fiber optics to the wand 42.

An important feature of the meter 10 is the optical coupling available with the meter reading unit 40 which is effected by placing the wand 42 over the I/O ports 28 and 30. Communication can then take place optically (and even through a glass cover over the housing 31). In this way, large amount of information which can be generated by the meter 10 can be quickly read by the meter reading unit 40.

Figure 5:
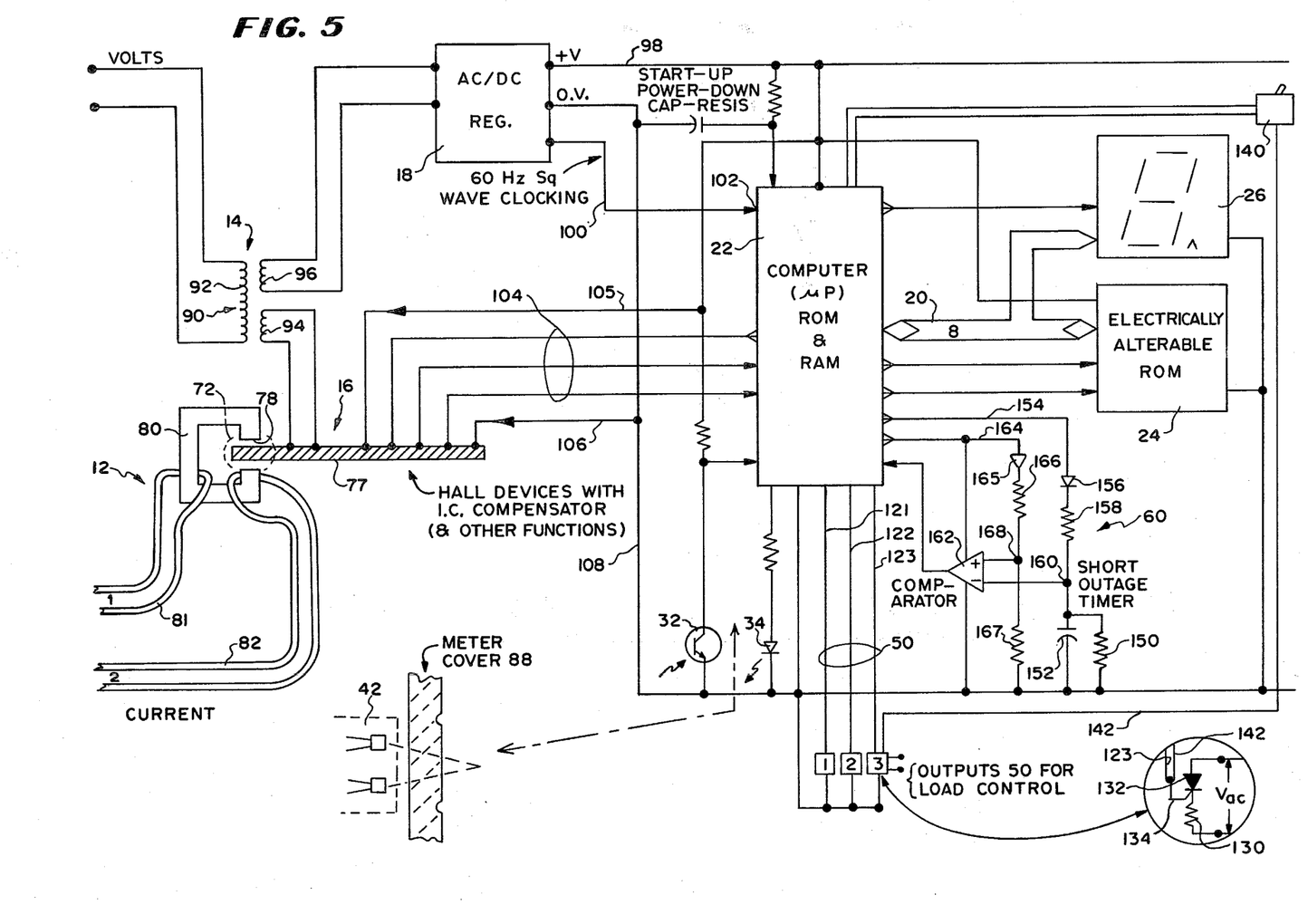
FIG. 5 is a schematic circuit diagram of the electrical circuit of the watt-hour meter shown in FIG. 1.

Eight load control input/output ports, generally identified by reference numeral 50 (See FIG. 1) are coupled to a microprocessor bus 20 (See FIG. 5). These and are available for the control of specific customer loads such as water heaters, air conditioners, electric heating, etc., as will be described in greater detail in connection with the description of FIG. 5. Also, the meter 10 can be programmed so that load control can be asserted by the customer/consumer or by the supplier/electric utility.

Finally, a power outage (loss of voltage) timer 60 is coupled to the microprocessor 22 for supplying a signal, when power is restored after a power outage, to the microprocessor 22. Such signal is indicative of the duration of the power outage so that the microprocessor 22 can update (correct) the real time value stored in the EAROM 24.

Figure 2:
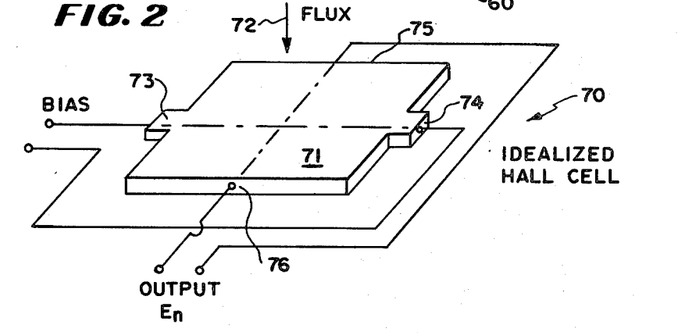
FIG. 2 is a perspective view of an idealized Hall cell representing the Hall type sensor utilized in the Hall multiplier shown in FIG. 1.

An idealized Hall cell 70 is shown in FIG. 2 and includes a Hall plate 71 which is located in a flux field, represented by an arrow 72, that is established by line current flowing through the first and second phases of a two-phase power supply to the consumer.

A bias voltage directly related to the line voltage is supplied to opposite sides 73 and 74 of the plate 71. The Hall plate 71 output voltage across the other two opposite sides 75 and 76 of the plate 71 is related to the instantaneous power, e.g. watts being supplied.

As shown in U.S. Pat. No. 2,550,492 the Hall plate output voltage can be defined substantially as follows:

$$E_h = K[VI \cos \theta - VI \cos (2wt + \theta)]$$

in which:

$E_h$ = Hall plate output voltage
K = a constant
V = voltage of source
I = line current supplied by source
$\theta$ = phase angle between V and I
w = radian frequency = $2\pi f$
t = time The direct current term (VI cos $\theta$) is proportional to real or active power. The average direct current in the output has a value of zero when no power is being transmitted.

Figure 3:
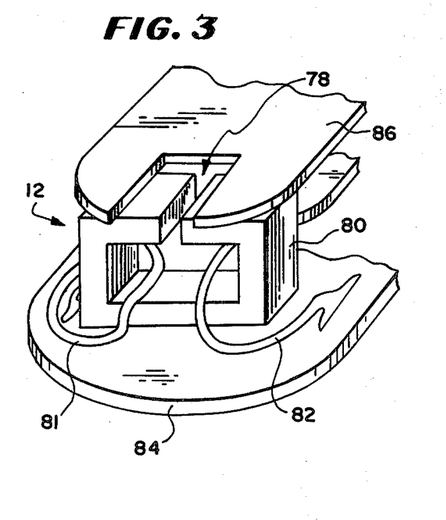
FIG. 3 is a perspective view of a current to flux generator including a yoke having a gap for receiving a Hall-effect chip.

Such a Hall plate is formed on a chip 77 (FIG. 5) which is received in an air gap 78 (FIG. 3) in a current transformer core or yoke 80 having two conductors, 81 and 82 of the voltage supplied to the customer/consumer passing therethrough. The yoke 80 is mounted on a base plate 84 and a mounting plate 86 is provided for mounting the chip 77.

Although not shown in FIG. 4, it will be understood that a transparent (glass) cover 88, a portion of which is shown at the bottom of FIG. 5, is received over the housing 31 to keep dust and dirt from getting in the housing 31, particularly ports 28 and 30.

The electronics portion of the meter 10 is preferably built on two main circuit boards (not shown), one for analog circuits and one for digital circuits, with two additional circuit boards, one for mounting transformer 90 (See FIG. 5), and one for mounting the Hall effect multiplier 16 which functions as a watt-hour generator.

Also, the meter 10, particularly the housing 31 thereof, is preferably sized to be interchangeable with existing induction watt-hour meters typical of those found in residential and apartment installations.

Referring now to FIG. 5, there is illustrated therein the schematic circuit diagram of the meter 10. As shown the voltage source (device) 14 includes a transformer 90 having a primary coil 92, a secondary winding 94 for supplying voltage to the Hall effect device and multiplier 16 in the chip 77 and a secondary winding 96 for supplying A.C. voltage to the A.C. to D.C. regulated power supply 18. The power supply 18 supplies a regulated D.C. voltage to a voltage bus 98 and the 60 Hz clock signal via a conductor 100 to a clock input 102 of the microprocessor 22.

The chip 77 having the Hall multiplier 16 is coupled via I/O conductors 104 to I/O ports of the microprocessor 22. It will be understood that the chip 77 has a plurality of Hall effect devices and multiplying circuitry therein. The inputs to the chip 77 are a flux 72 generated by the line current in conductors 81 and 82, line voltage from winding 94, and a source of power via conductor 105 connected to the voltage bus 98 and conductor 106 connected to system common or ground 108 for timing and to control several self calibration features. The output of this chip 77 is a square wave signal proportional to watt-hours.

The chip 77 is manufactured by Texas Instruments and key additional external elements in the chip 77 and circuitry thereof are: (1) RC integrator parts consisting of a resistor of about 200K ohms and a capacitor of 0.66 microfarads, (2) a 2.2K ohm feedback resistor, (3) two 1 microfarad capacitors to stablize the circuitry, (4) two 100K ohm resistors for bias, and (5) a potentiometer for bias adjustment.

The basic calibration of the meter selecting a resistor of about 200K ohms in the R-C network. This adjustment sets the Kh of the meter and compensates for such variables as the gap 78 in the Hall multiplier 16, the gain in amplifiers in the chip 77, and the accuracy of the 0.66 microfarad capacitor. The potentiometer is used to eliminate the effect of an unwanted voltage-caused effect on the chip 77.

An additional error resulting from the use of Hall effect devices in the chip 77 causes the circuitry (i.e. analogous to a standard watt-hour meter having a rotating induction disk which moves or rotates without any power being supplied to the watt-hour meter). The creep can be "forward" or "backward", and there is no striction to suppress this error. This can be compensated by the addition of a "tickler" coil on the current transducer core or yoke 80 to zero set or to add sufficient amp turns to negate any creep.

As with most solid-state devices, the Texas Instrument chip is sensitive to temperature. Variations in outputs from a nominal ambient temperature over a temperature range between −20° C. and +50° C. accounted for an error up to 2.5%.

Three of the load control outputs identified by reference numerals 121, 122 and 123 are shown in FIG. 5 coming out of the microprocessor 22 for controlling customer/consumer loads. For example, the output 123 can be considered as connected to a water heater load shown in the blowup in FIG. 5 as a resistance load 130. This load 130 is connected in series with an SCR 132 across the A.C supply voltage. The SCR 132 forms a load circuit breaker. A gate 134 of the SCR 132 is coupled to the microprocessor load control output 123 so that the microprocessor 22 can control when the load 130 is energized. Typically, the load 130 is energized during the early evening, night-time and early morning when the cost per KWH is low and de-energized during the daytime when the cost per KWH is high.

According to the teachings of the present invention, an override switch 140 is provided coupled to the microprocessor 22 to enable the customer to override the load control function of the microprocessor 22. In the illustrated embodiment the switch 140 is also coupled to the gate 134 via a conductor 142. Thus, by operating the switch 140, e.g. during the day, the customer can energize his hot water heater overriding the microprocessor 22.

Also, according to the teachings of the present invention, the microprocessor 22 and EAROM 24 are connected and programmed to reset the switch 140 to the open position thereof. In other words, if the switch 140 had been operated (closed) by the customer, the microprocessor 22 operates the switch 140 to the open position.

The meter 10 has no battery and derives its time from the power line, namely the 60 Hz clock signal. Since the meter 10 must accurately keep real time to support its time-of-day functions, loss of electrical power to the meter would destroy the time-of-day functions. To keep time without system voltage, the power outage timer (loss of voltage timer) 60 is included in the meter 10.

This timer 60 is based on an R-C network, comprising resistor 150 connected across capacitor 152, where the recharge time is proportional to the outage time. If the recharge time indicates the outage has been greater than 6 hours then the time is not recoverable and default conditions must be used. In that case the corrected time in the meter 10 is reloaded during the next meter reading operation by the meter reading unit 40.

As shown in FIG. 5 the power outage timer 60 has other components which will now be described and is one of several timers that can be used, such other timers being of the type disclosed in U.S. patent application Ser. No. 303,599 filed Sept. 18, 1981 entitled: POWER OUTAGE TIMER, the disclosure of which is incorporated herein by reference.

The timer 60 has a voltage supply line 154 from the microprocessor 22 which charges the capacitor 152 through a diode 156 and resistor 158 to a voltage level at junction 160 related to the supply voltage. The voltage at junction 160 is coupled to one input of a comparator 162. Another voltage supply line 164 from the microprocessor 22 supplies a voltage through a diode 165 to a voltage divider 166, 167. A point (junction) 168 in the divider 166, 167 is coupled to another input of the comparator 162 and has a normal voltage which is equal to or slightly less than the normal voltage on the capacitor 152. The output of the comparator 162 is connected to the microprocessor 22.

After a power outage, the time from the reestablishment of the A.C. supply voltage to the time the voltage at junction 160 equals or exceeds the voltage at point 168 is converted by the microprocessor 22 to the real time elapsed and added to the real time value in the EAROM 24 to correct the real time value therein.

After the meter 10 is installed, the microprocessor 22 is designed to restart after power outages and to be operating properly within about three seconds. The arrival of A.C. power starts the power supply 18 that causes the microprocessor 22 to initialize itself and all related functions by calling data from its ROM and EAROM 24. It also counts each restart operation as part of a power theft detection means.

One of the last steps in initialization is for the microprocessor 22 to note the voltage on the comparator 162 that looks at the capacitor voltage on timer capacitor 152. The microprocessor 22 then causes the capacitor 152 to charge or discharge in such a way that the comparator's output voltage will change when its threshold voltage at point 168 is crossed. The time to this change is measured. With this time and the polarity of the charge or discharge operation the duration of the outage is calculated. If the calculated outage exceeds 6 hours, the microprocessor 22 then calls for a default condition rather than trying to establish an undependable time.

The microprocessor 22 performs several interrupt routines, one of which is: Watthour Pulse Reception. Here, the microprocessor 22 watches for pulses from the chip 77 indicating a fixed quantity of watthours has passed. The software can track pulses at a rate up to 133 pulses per second, as well as apply a preselected calibration factor. These features permit a large variation in manufacturing variations of the watthour sensor and generator chip 77.

Another interrupt routine is: Three Millisecond Timer. Every three milliseconds the microprocessor checks to determine if (1) a sixty hertz (60 Hz) square wave has changed polarity for keeping up the real time clock or (2) the phototransistor 32 has changed state to note if a communication effort with the meter 10 has been started. Further, the three millisecond clock is used to control the timing of the display function on display 26.

The third interrupt routine is: Main Task Loop. The key task of the meter 10 is to count watt hours into the proper time-of-use register. The meter 10 will also calculate peak demands on a 15-minute running average and the time of the peak demand for each time-of-use period. The meter 10 must keep an accurate time-of-day clock to do these calculations. The Main Task Loop also controls the information that is kept in the EAROM 24 to insure that no important information is lost on a loss of voltage situation. This function of the meter 24 also controls the data that is to be presented on the display 26.

From time to time the meter will be read by the Unit 40 and the battery-operated microprocessor therein. When the Unit 40 sends its interrogation signal via wand 42 to the meter 10, the software program must identify this as a different signal than a change in light level used in manual readout. Upon this determination the meter 10 sends a clock synchronization pulse train to the meter-reading Unit 40. With communication established and clocks synchronized, any amount of predetermined information can be exchanged.

The meter-reading Unit 40 is a portable tool designed to read out the content of the meter 10. The Unit 40 microprocessor and the various other parts that relate to a microprocessor system are utilized to read out the meter 10 by placing the wand 42 properly centered on the face or cover 88 of the meter 10 and pushing a trigger on the wand 42. In about 2 seconds the unit 40 and meter 10 will:

1. Establish contact and determine the communication frequency to use.
2. Read the serial number and/or the account into the Unit 40.
3. Check and correct (if necessary) the real time clock, noting if a correction was made.
4. Check and correct (if necessary) the time-of-use times, noting if a correction was made.
5. Read the main register and the time-of-use registers.
6. Read counters or registers (and reset if proper) other indicators on the meter 10.

When all elements of the readout have finished, a tone or other indication will be given the operator by the Unit 40 indicating that the readout is finished. After finishing a readout at one meter 10, the operator proceeds to the next meter 10 and repeates the procedure. After completion of a day's route, the operator returns the meter-reading Unit 40 to a central location where it is coupled to a host computer that reads out the Unit 40 for higher level data processing. The host computer can also load new data for the next day's route.

The meter-reading Unit 40 can also have an onboard keyboard and display to permit operator control of the Unit 40 and thus the ability to do selective modifications of meter 10 and readout of a meter 10 through the display 26 thereof.

Various routines which can be programmed into and performed by the microprocessor 22 system are described below with reference to FIGS. 6 through 14.

BASIC START-UP ROUTINE

Figure 6:
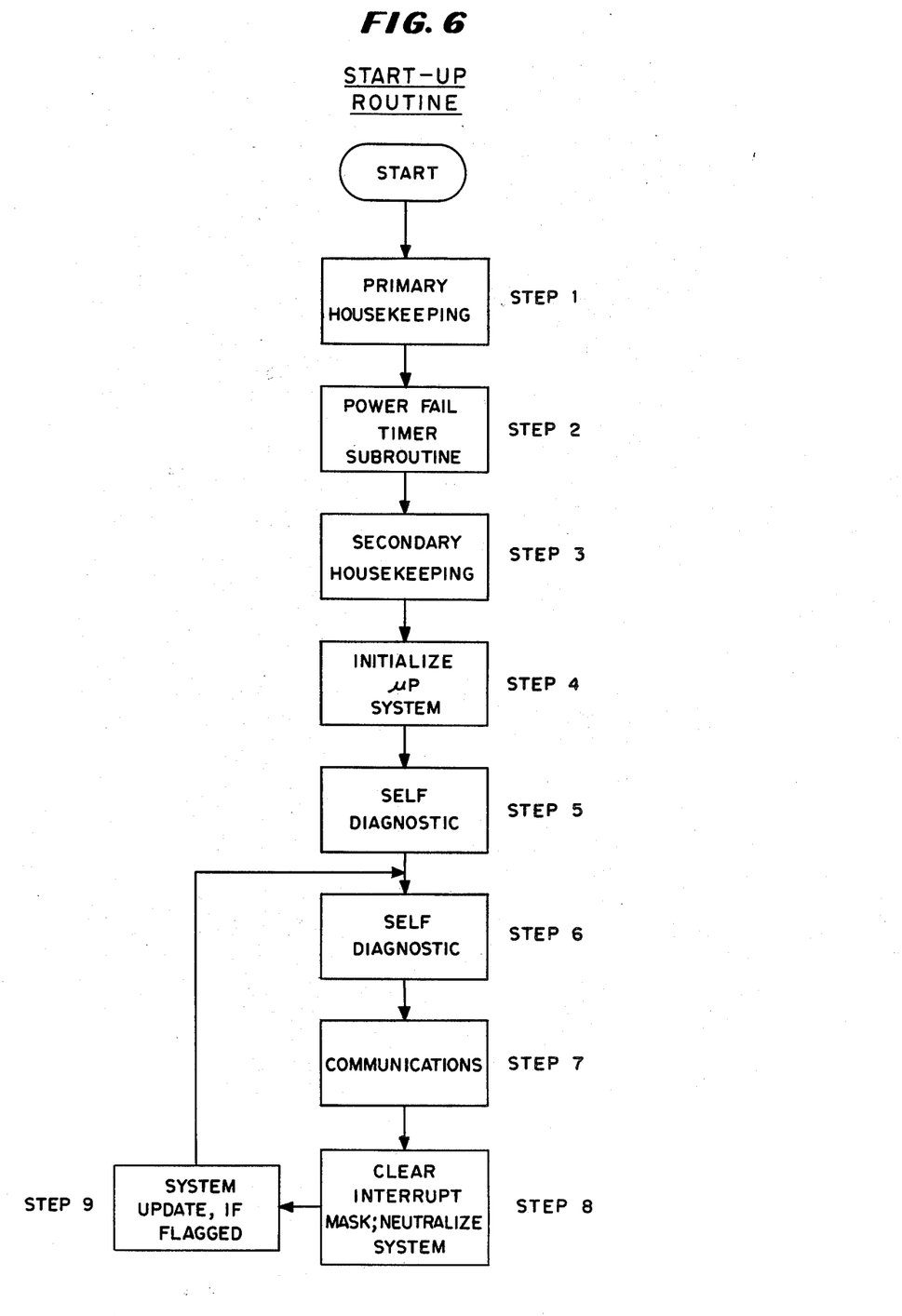
FIG. 6 is a flow chart for the Start-up Routine which has been programmed into the present invention.

In FIG. 6 there is shown a Basic Start-Up Routine in which, at Step 1 primary housekeeping routines are performed, such as setting an interrupt mask for the microprocessor 22, setting up a stack pointer and input-/output default conditions and neutralizing the system address.

At Step 2, a Power Failure Time Routine is performed as described in further detail hereinbelow in connection with the description of FIG. 7.

At Step 3, secondary housekeeping routines are performed such as real time clock setup, serial communications flag set, interrupt mask clear, system updates, flag clear, flag check and initialization-configuration setup.

At Step 4 the microprocessor 22 system is initialized.

At Steps 5 and 6 self-diagnostic routines are performed.

Communications are performed at Step 7.

At Step 8 a clear interrupt mask is performed, which allows updating on interrupts from the watt-hour sensor 16 or real time clock.

If the system is flagged, a system update routine is performed at Step 9 and then returned to self-diagnostics at Step 6.

POWER FAILURE ROUTINE

Figure 7:
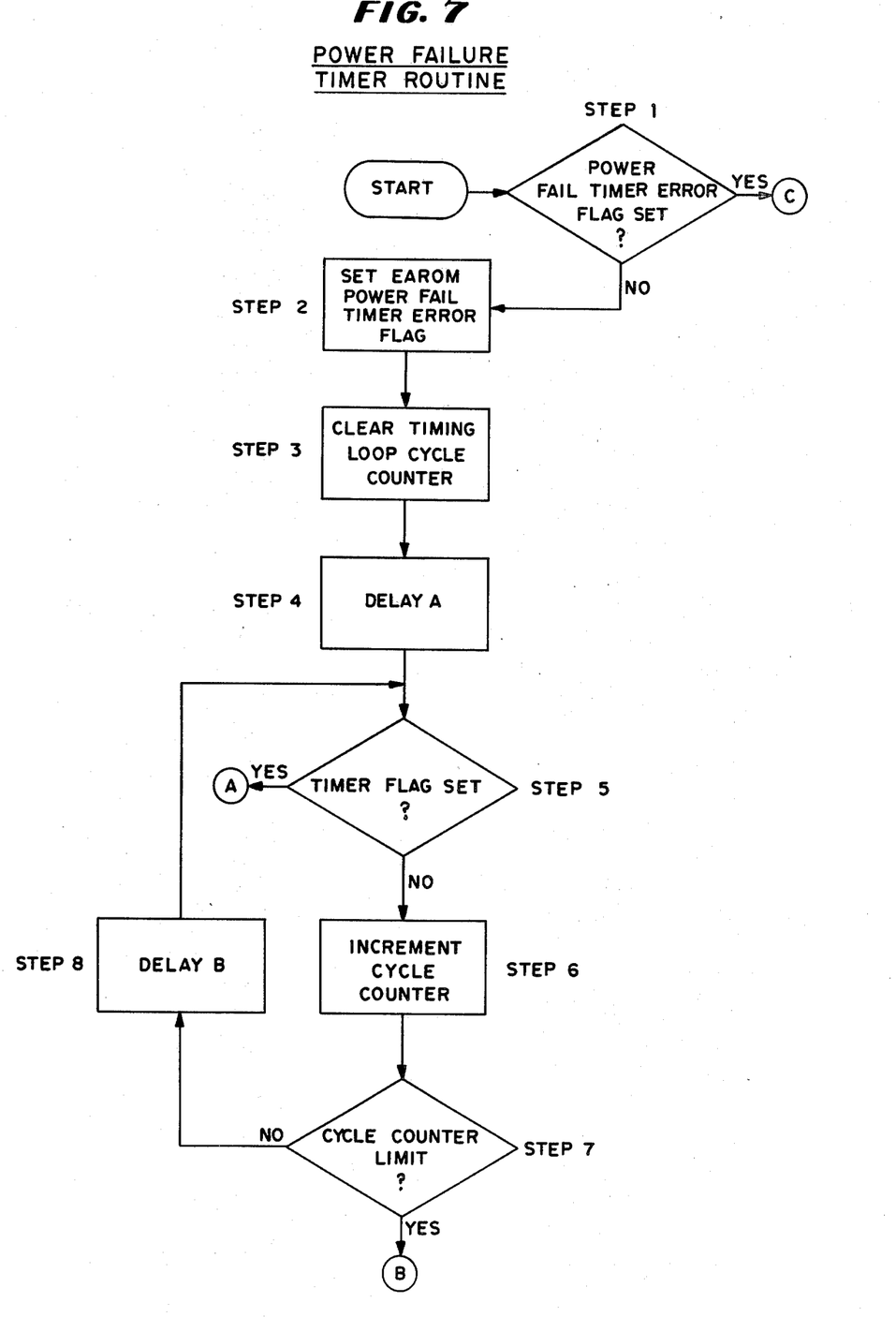
FIGS. 7 and 8 comprise a flow chart for the Power Failure Timer Routine which has been programmed into the present invention.
Figure 8:
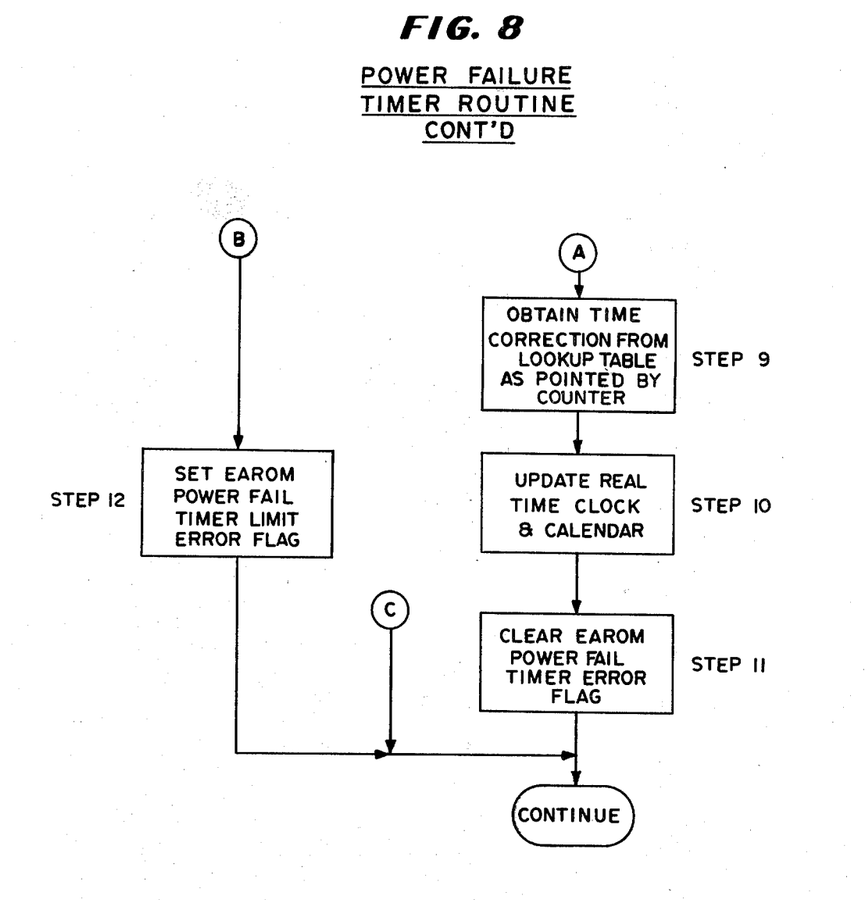

In FIGS. 7 and 8 the Power Failure Timer Routine is illustrated in which, at Step 1, the microprocessor 22 system determines whether a power fail timer error flag is set and if so, the system proceeds to C at FIG. 8.

If not, at Step 2 the power fail timer error flag of EAROM 24 is set. At Step 3 the system clears the timing loop cycle counter of the microprocessor 22.

The system then enters a delay A at Step 4.

At Step 5 it is determined whether the timer flag is set, which is a hardware flag.

If so, the system goes to A of FIG. 8, and if not, an internal cycle counter is incremented at Step 6.

If the cycle counter is at its limit at Step 7, the system goes to B of FIG. 7, and if not, a second delay B is entered at Step 8 before the system routine returns to Step 5.

Continuing the routine at A in FIG. 8 at Step 9, the system obtains the time correction from a look up table is pointed out by the cycle counter at Step 7.

At Step 10, the system updates the real time clock and calendar.

At Step 11 the system clears the EAROM power fail timer error flag.

Figure 9:
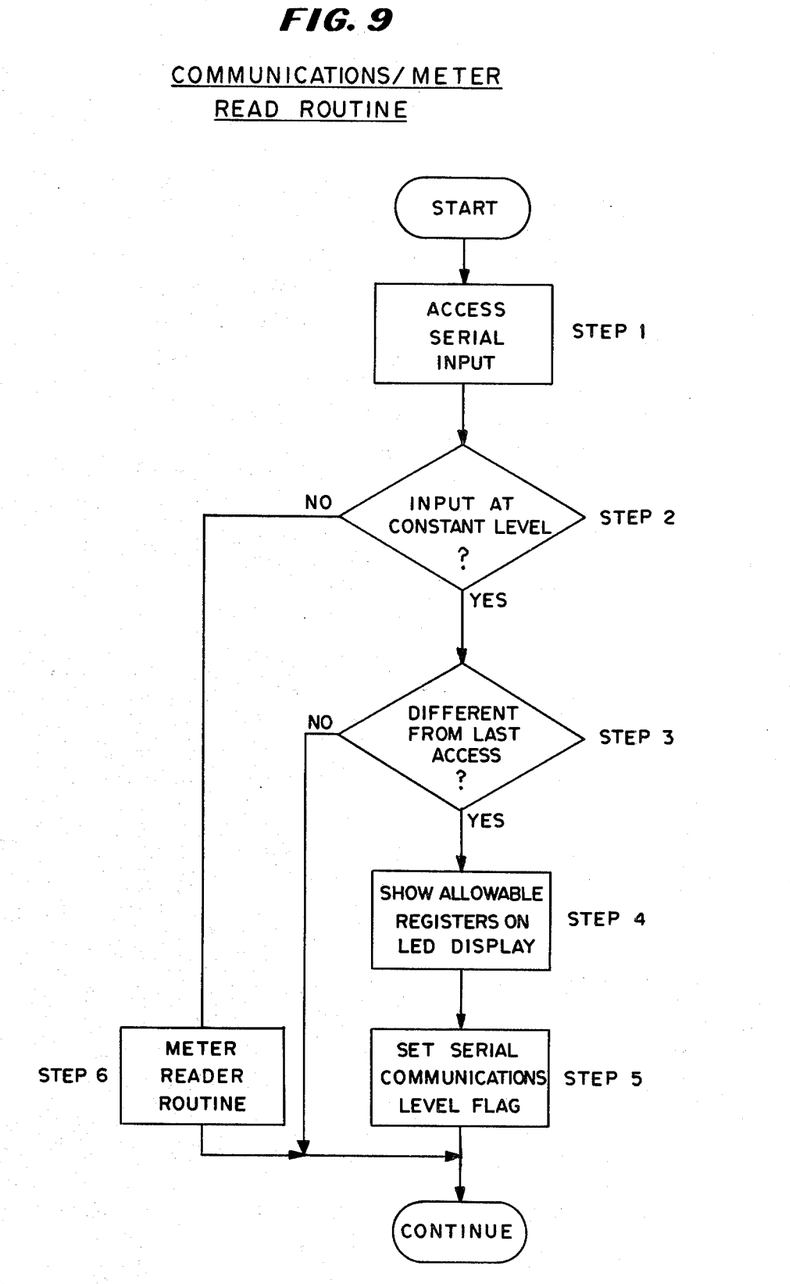
FIG. 9 is a flow chart for the Communications/Meter Read Routine which has been programmed into the present invention.

Continuing the routine at B in FIG. 8, at Step 12, the EAROM power fail timer limit error flag is set after which the system is ready for the Communications/Meter Read Routine in FIG. 9.

COMMUNICATIONS/METER READ ROUTINE

In FIG. 9 is illustrated the Communications/Meter Read Routine in which, at Step 1, the system accesses the serial input to the meter 10.

At Step 2 a determination is made whether the input is at a constant level, which is an indication that a customer or meter reader is attempting access.

If the input is at a constant level, the system goes to Step 3 to determine whether the input is different from the last access which checks the serial communication level flag in the random access memory (RAM).

If the access is not different at Step 3, the system continues.

If it is different, the system at Step 4 will show allowable registers for an LED display. At Step 5 the system sets zero communications level flag which is a "1" if a serial input is high and a "0+ if the zero input is low.

At Step 2, if the input level is not constant, the system goes to Step 6, which is a meter reader routine and which is suspended if more than 200 watt-hour interrupts occur.

SYSTEM UPDATE ROUTINE

Figure 10:
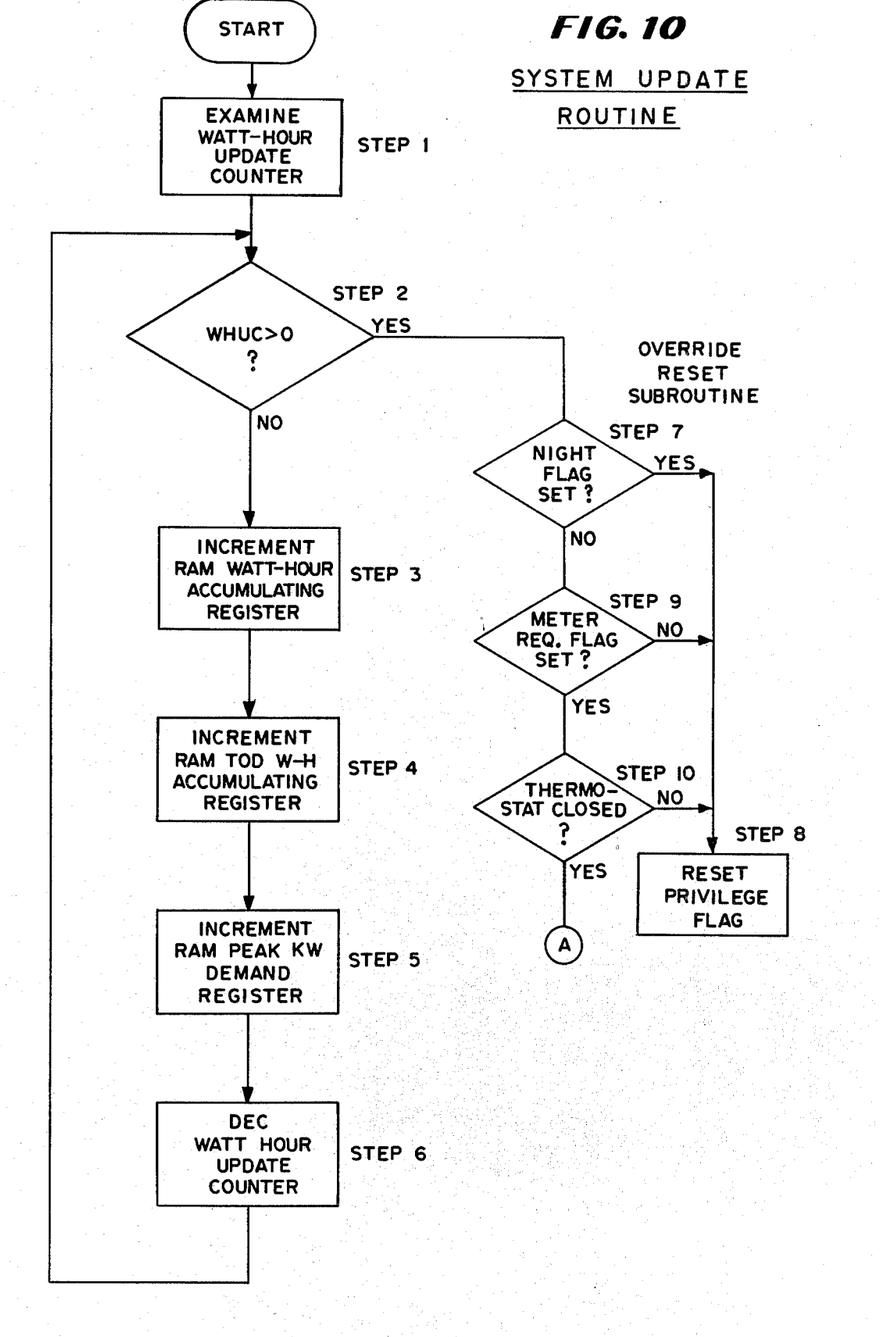
FIGS. 10, 11 and 12 comprise a flow chart for the System Update Routine which has been programmed into the present invention.
Figure 11:
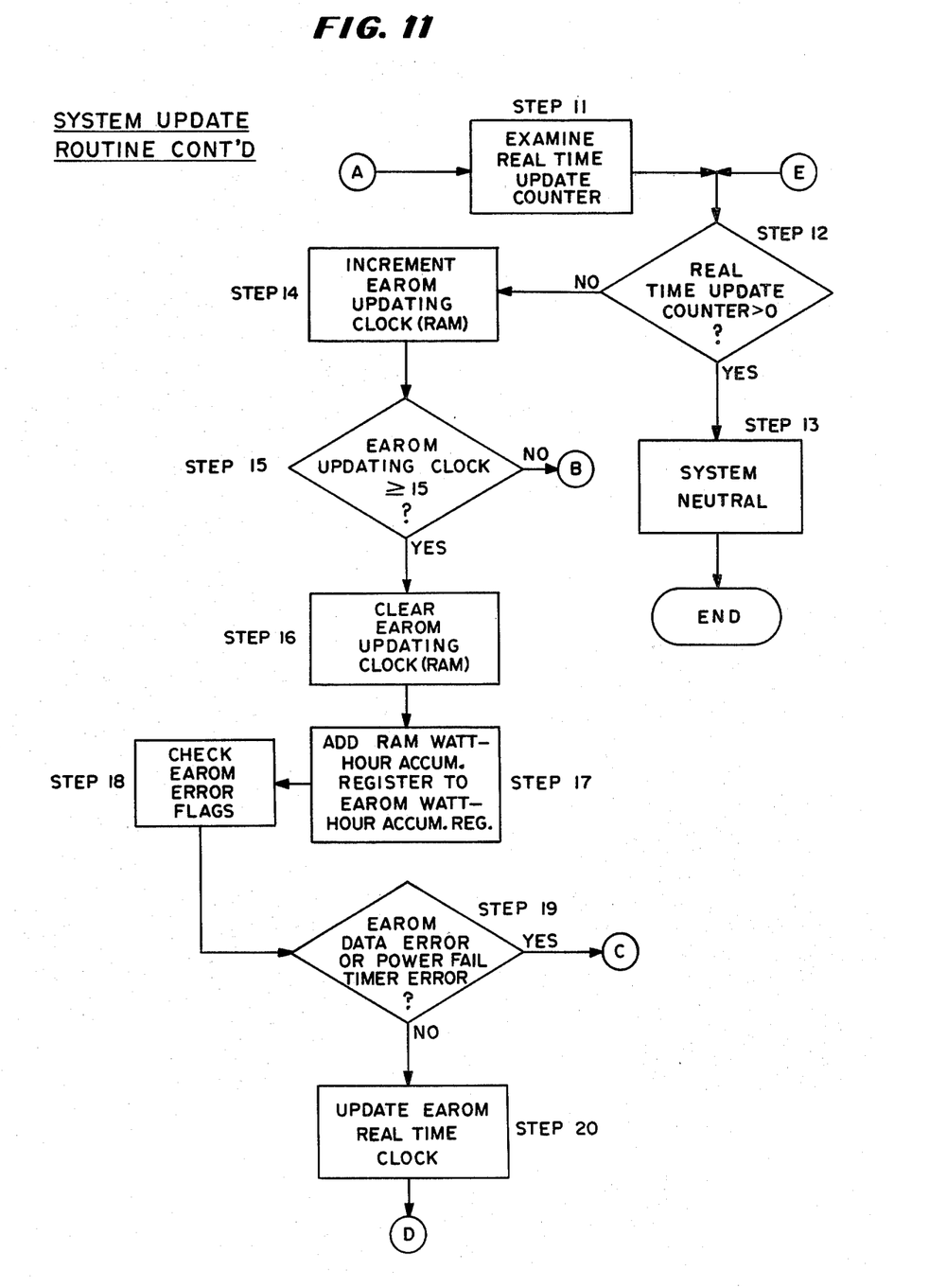
Figure 12:
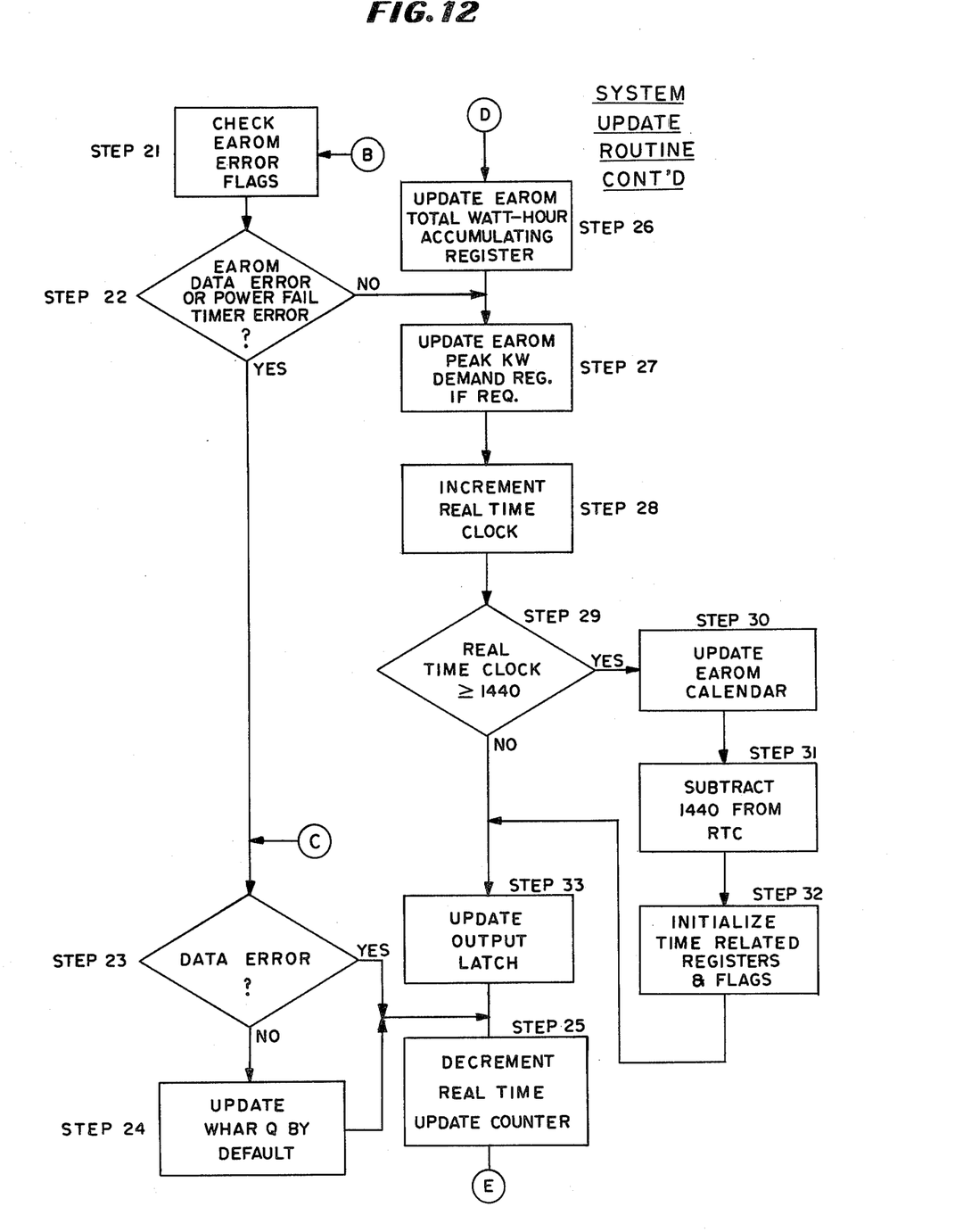

In FIGS. 10, 11, 12 a System Update Routine is illustrated.

At Step 1 the system examines the watt-hour update counter (WHUC).

At Step 2, if the WHUC is greater than zero, the system goes to an Override Reset Subroutine, and if not to Step 3.

At Step 3 the system increments the RAM watt-hour accumulating register.

At Step 4 the system increments the RAM accumulating register.

At Step 5 the system increments the RAM peak kilowatt demand register.

At Step 6 the system decrements the watt-hour update counter (WHUC) after which the system returns to Step 2.

If WHUC is greater than zero, the system goes to the Override Reset Subroutine which begins at Step 7 where the question is asked: Is the night flag set? for causing energization of a controlled customer load, e.g. a water heater for energizing the water heater.

If the answer is yes, the system knows that it is nighttime and goes on to Step 8, the reset privilege flag step where the override switch is reset to the open position.

If the answer is no, then at Step 9 the question is asked: Is the meter request flag set? and if not, the system goes to Step 8, and if yes, to Step 10.

At Step 10 the question is asked, Is the thermostat closed? If not, the system again goes to Step 8 and if yes, to A in FIG. 11 and Step 11.

At Step 11 the system examines the real time update counter.

At step 12 the real time update counter is examined to see if the count is greater than zero.

If the counter is greater than zero, the routine ends at Step 13 where the system goes to a neutral condition.

If not, at Step 14 the system increments the EAROM updating clock.

After that at Step 15 the EAROM update clock is examined to see whether it is greater or equal to 15.

If not, the system goes to B in FIG. 12.

If yes, the system goes to step 16, in which the EAROM updating clock is cleared.

At step 17, the system adds the RAM watt-hour accumulator register to the EAROM watt-hour accumulator register and goes to step 18, which checks the EAROM error flags.

At step 19, the EAROM data error or power fail timer error is checked, and if there is an error, the system goes to C in FIG. 12.

If not, the system goes to step 20, in which the EAROM real time clock is updated.

From the input B in FIG. 12, the system, at step 21, checks the EAROM error flags as at Step 18.

At Step 22, a check is made for an EAROM data error or power fail timer error as at Step 19.

If there is, the system goes to Step 23 to check if a data error has occurred as it does at C from Step 19. If there are not data errors at Step 24, the address register is updated by default and the system goes to Step 25. If there is a data error at Step 23, the system still goes to Step 25 where the real time update counter is decremented and the system returns to E in FIG. 11 where it repeats Step 12 and checks to see if the real time update counter is greater than zero and if so, the system goes to neutral at Step 13.

Returning to D from FIG. 11 back to D in FIG. 12 at the next Step 26, the system updates the EAROM watt-hour accumulating register.

At Step 27 the EAROM peak kilowatt demand register is updated, if required.

At Step 28 the real time clock is incremented.

At Step 29 a determination is made if the real time clock is greater than or equal to 1440.

If so, the system goes to Step 30 which updates the EAROM calendar.

At Step 31, 1440 is subtracted from the real time clock.

At Step 32, the time related registers and flags are initialized and the system goes to Step 33 as does the NO path from Step 29.

At Step 33 an output latch is updated, and from there the system goes to Steps 29, 12 and 13 and ends.

INTERRUPT ROUTINE

Figure 13:
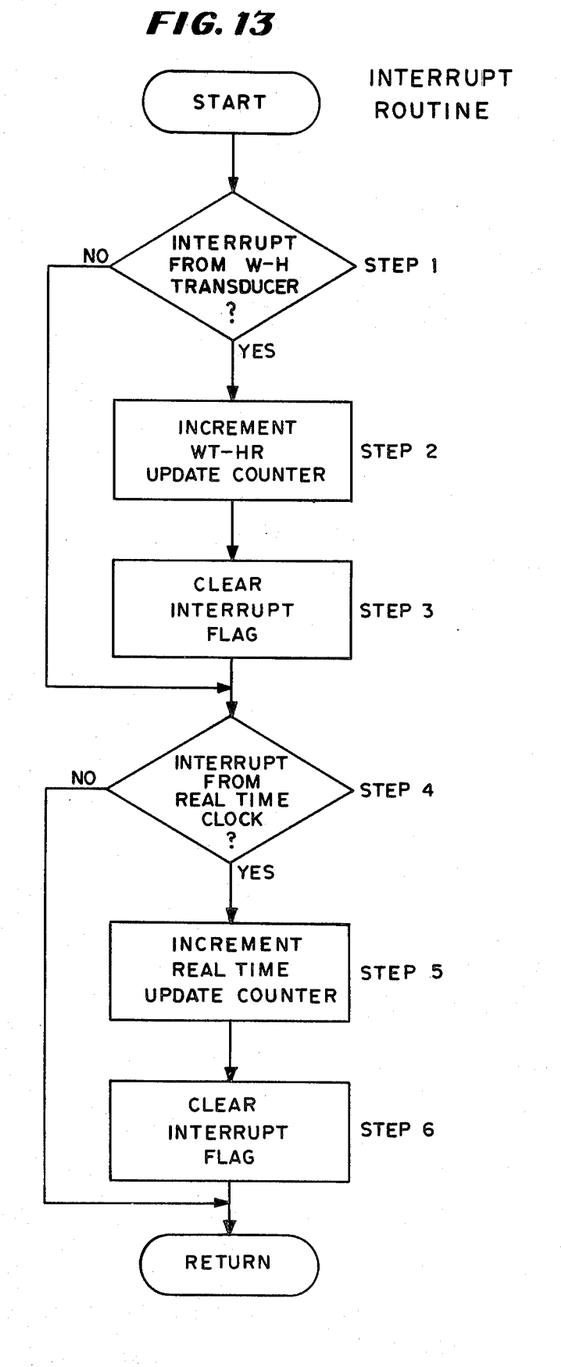
FIG. 13 is a flow chart of the Interrupt Routine which has been programmed into the present invention.

In FIG. 13, an interrupt routine is shown in which, at Step 1, the watt-hour generator inputs 104 are checked for interrupt.

If so, at Step 2 the system increments the watt-hour update counter and at Step 3, clears the interrupt flag before going on to Step 4.

At Step 4, or if there is no interrupt at Step 1, the system checks an interrupt from the real time clock.

If there is an interrupt, at Step 5 the system increments the real time update counter and then at Step 6 clears the interrupt flag and returns to normal.

Also, if there is no interrupt at Step 4, the system returns to normal.

From the foregoing description, it is apparent that the solid state watt-hour meter 10 of the present invention has a number of advantages, some of which have been described above and others of which are inherent in the invention. For example, the meter 10 has no moving parts, being based on Hall effect technology and can replace the conventional industion watt-hour meters. Additionally, the meter 10 is a "smart" meter incorporating a microprocessor and related parts which can measure watt-hours and peak watts with respect to time and store this information in appropriate time-of-use registers so that electric power is used only when it is most economical to do so. Moreover, the override switch and reset function make it very attractive to consumer customers.

The features of manual readout by eye or automatic readout with the meter reading unit 40, constitute further advantages.

It will also be apparent that many modifications can be made to the meter 10 without departing from the teachings of the present invention. For example, an optical or conventional induction disk watt-hour sensor can be used in place of the Hall effect watt-hour sensor and generator 16. Accordingly, the scope of the invention is only to be limited as necessitated by the accompanying claims.

We claim:

1. A solid state watt-hour meter, comprising:
   a Hall-Effect watt-hour sensor, connectable to a consumer's connection to a source of electric power, for sensing the line voltage supplied to and the line current drawn by the consumer's total electric load, said total electric load comprising a plurality of consumer electric loads, and for producing an output signal in the form of a train of square waves indicative of a quantity of watt-hours of power utilized by the consumer;
   a microprocessor coupled to said watt-hour sensor for receiving said output signal, said microprocessor having at least one load control output which operates a circuit breaker which supplies at least one of said consumer loads, and having at least one switch input which senses the position of a switch;
   an electrically alterable ROM operatively coupled to said microprocessor;
   power supply means, having an input operatively coupled to the consumer line voltage and an output coupled to said microprocessor, for supplying a regulated DC voltage thereto;
   clock signal generating means, operatively coupled between said consumer line voltage and said microprocessor, for supplying a 60 Hz clock signal to said microprocessor;
   readout means, operatively coupled to said microprocessor, for providing a readout of the power consumed since the last reading of said solid state watt-hour meter;
   power outage timing means, operated in response to said power supply means, for supplying a signal which is characteristic of the duration that said power supply means was inoperative due to a loss of power to said consumer's connection, said power outage timing means including a capacitor which discharges when said power supply means is inoperative and which charges when said power supply means is placed in operation; and
   an override switch coupled to said switch input of said microprocessor and said circuit breaker,
   said electrically alterable ROM and microprocessor being connected and programmed:
   (a) to compute the time of day as determined from an initial time of day setting and said 60 Hz clock signal and to store said time of day in said electrically alterable ROM;
   (b) to compute the total power used by the consumer and to store said total power in said electrically alterable ROM;
   (c) to provide a readout signal indicative of the total power consumed since the last reading of the meter;
   (d) to automatically open said circuit breaker for a time period during the time of day when power demand on said source of electric power is above a first predetermined value and/or the cost per kilowatt hour of said power is above a second predetermined value;
   (e) to automatically close said circuit breaker during the time of day when the power demand on said source of electric power is at or below said first predetermined value and/or the cost per kilowatt hour of said power is at or below said second predetermined value;
   (f) to allow the consumer to override said microprocessor control of said circuit breaker by operating said override switch to close said circuit breaker;
   (g) to automatically reset said override switch when said microprocessor functions to automatically close said circuit breaker; and
   (h) to correct the value of the time of day stored in said electrically alterable ROM by using the signal from said power outage timing means in the event that said power supply means is temporarily inoperative.

2. The solid state watt-hour meter according to claim 1, wherein said readout means comprises: a numerical LED display and; optical signal producing and receiving means for transferring data to and from said microprocessor, said signal producing and receiving means including at least one light-emitting diode and at least one photo transistor.

3. The solid state watt-hour meter according to claim 1: wherein said power supply means provides a reference voltage, and wherein said capacitor is charged by said power supply, and
   further including: a shunt resistor which is connected across said capacitor, a comparator having a first input operatively connected to said capacitor, a second input operatively connected to said reference voltage, and an output operatively coupled to said microprocessor, said reference voltage normally being at or just below the normal voltage across said capacitor whereby said comparator produces an output signal when said capacitor is charged to its normal voltage, said electrically alterable ROM and said microprocessor being further programmed:

(a) to sense a first point in time when power is restored after a power outage;

(b) to sense a second point in time when said comparator produces an output signal indicating said capacitor has recharged, after having discharged through said shunt resistor during a power outage, back to its normal value;

(c) to calculate the real time represented by the time interval between said first and second points in time; and (d) to use said calculated value of real time to update the value of the time of day stored in said electrically alterable ROM when power was lost to said consumer's connection.

4. The solid state watt-hour meter according to claim 3, wherein said microprocessor and said electrically alterable ROM are further programmed:

(a) to determine if the time between said first and second points in time is equal to a maximum pre-set time interval which is representative of the time to fully charge said capacitor with said power supply; and (b) when equality is determined to close said circuit breaker and to signal an alarm indicating that the time of day stored within said electrically alterable ROM needs to be corrected and updated.

* * * * *